US012704414B2

(12) United States Patent
Schafferhans et al.

(10) Patent No.: US 12,704,414 B2
(45) Date of Patent: Aug. 11, 2026

(54) TEMPERATURE MEASURING DEVICE FOR ELECTRICAL CONTACT ELEMENT

(71) Applicant: LISA DRÄXLMAIER GMBH, Vilsbiburg (DE)

(72) Inventors: Stephan Schafferhans, Munich (DE); Krzysztof Murgott, Unterschleißheim (DE)

(73) Assignee: LISA DRÄXLMAIER GMBH, Vilsbiburg (DE)

( * ) Notice: Subject to any disclaimer, the term of this patent is extended or adjusted under 35 U.S.C. 154(b) by 297 days.

(21) Appl. No.: 18/356,772

(22) Filed: Jul. 21, 2023

(65) Prior Publication Data

US 2023/0358615 A1 Nov. 9, 2023

Related U.S. Application Data

(63) Continuation of application No. PCT/EP2021/082537, filed on Nov. 22, 2021.

(30) Foreign Application Priority Data

Jan. 22, 2021 (DE) ......................... 102021101349.6

(51) Int. Cl.
*G01K 1/143* (2021.01)
*B60L 53/16* (2019.01)
(Continued)

(52) U.S. Cl.
CPC .............. *G01K 1/143* (2013.01); *B60L 53/16* (2019.02); *H01R 13/20* (2013.01); *H05K 1/0201* (2013.01);
(Continued)

(58) Field of Classification Search
CPC ...... G01K 1/143; G01K 2217/00; G01K 1/16; G01K 1/14; G01K 1/18; G01K 7/18;
(Continued)

(56) References Cited

U.S. PATENT DOCUMENTS

| | | | |
|---|---|---|---|
| 9,919,609 | B2 | 3/2018 | Kretschmer et al. |
| 10,530,101 | B2 | 1/2020 | Rose et al. |

(Continued)

FOREIGN PATENT DOCUMENTS

| | | |
|---|---|---|
| CN | 208171458 U | 11/2018 |
| CN | 208238969 U | 12/2018 |

(Continued)

OTHER PUBLICATIONS

Computer translation of DE 102015106251 A1 (Year: 2025).*
Computer translation of DE 102018120057 A1 (Year: 2025).*
Computer translation of WO 2020004176 A1 (Year: 2025).*

*Primary Examiner* — Randy W Gibson
(74) *Attorney, Agent, or Firm* — Burris Law, PLLC

(57) ABSTRACT

The present disclosure relates to a temperature measuring device for measuring a temperature of a pin-shaped electrical contact element, which includes a flexible circuit board with a first thermally conducting and electrically insulating substrate layer. The first substrate layer includes a contact surface that is configured to lie flat against a flange of the pin-shaped electrical contact element and an opening disposed in the contact surface. The pin-shaped electrical contact element is disposed at least partially in the opening. The flexible circuit board further includes a second thermally and electrically conducting layer that is disposed on a sensor surface opposite the contact surface of the first substrate layer and includes a sensor element connected to the sensor surface. The sensor element is configured to record a temperature of the pin-shaped electrical contact element when the pin-shaped electrical contact element is at least partially disposed in the opening.

15 Claims, 6 Drawing Sheets

Figure 1A:
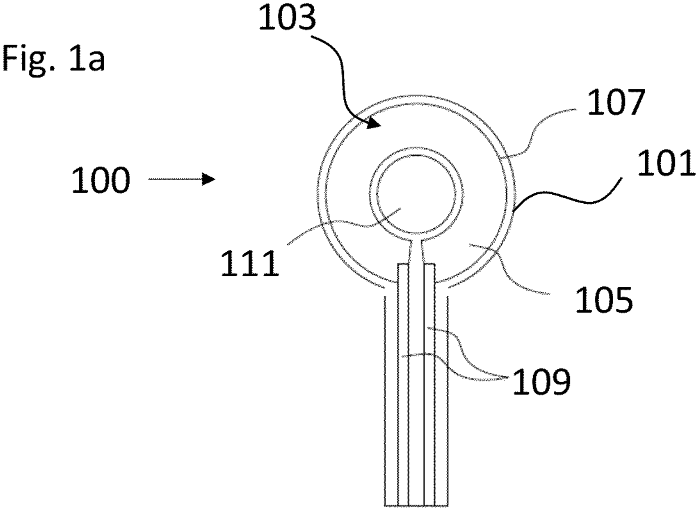

(51) Int. Cl.

| | |
|---|---|
| ***H01R 13/20*** | (2006.01) |
| ***H05K 1/02*** | (2006.01) |
| ***H05K 1/05*** | (2006.01) |

(52) U.S. Cl.
CPC ............... *H05K 1/028* (2013.01); *H05K 1/05* (2013.01); *G01K 2217/00* (2013.01); *H05K 2201/05* (2013.01); *H05K 2201/06* (2013.01); *H05K 2201/10303* (2013.01)

(58) Field of Classification Search
CPC .. G01K 7/22; B60L 53/16; B60L 3/04; H01R 13/20
See application file for complete search history.

(56) References Cited

U.S. PATENT DOCUMENTS

| | | | |
|---|---|---|---|
| 10,985,507 | B2 | 4/2021 | Rose et al. |
| 2020/0412069 | A1 | 12/2020 | Malandain et al. |

FOREIGN PATENT DOCUMENTS

| | | | | | |
|---|---|---|---|---|---|
| DE | 102015106251 | A1 | * | 10/2016 | ................ B60L 3/00 |
| DE | 102016107401 | A1 | | 8/2017 | |
| DE | 102018120057 | A1 | | 2/2019 | |
| WO | WO-2020004176 | A1 | * | 1/2020 | ............... G01K 1/14 |

* cited by examiner 103
107
101
100
111
105
109

203
205
115
105
117
107
100
113
109
101
201
200

103
107
111
100
101
105
109

203
205
119
117
100
107
109
113
105
101
201
200

Fig. 3a
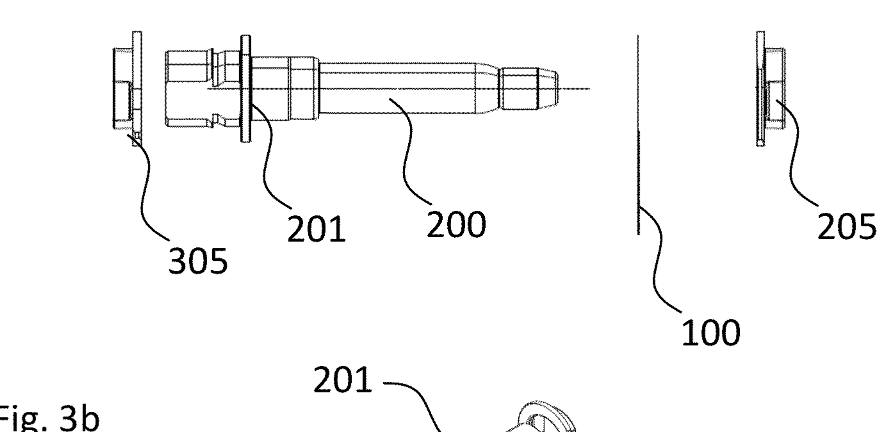
Fig. 3b
201
105
305
200
100
205
Fig. 3c
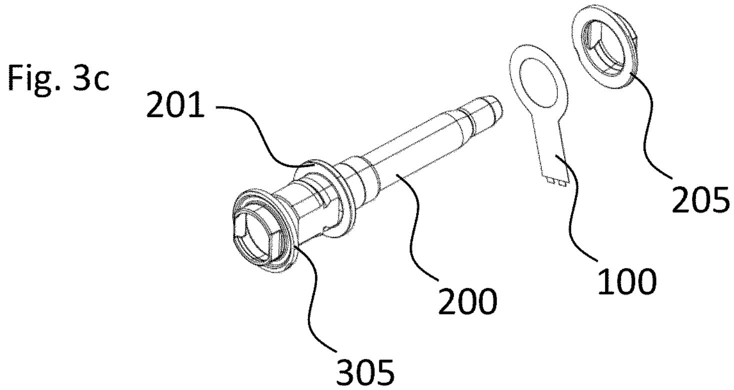

302
200
300
205
303
201
100
304
305
301

302
200
300
205
303
201
100
304
305
301

600
Provide first thermally conducting and electrically insulating substrate layer
601
Apply second thermally and electrically conducting layer
602
Apply third insulating layer
603
Dispose temperature measuring device on pin-shaped electrical contact element
604
Dispose assembly in a housing
605

TEMPERATURE MEASURING DEVICE FOR ELECTRICAL CONTACT ELEMENT

CROSS-REFERENCE TO RELATED APPLICATIONS

This application is a continuation of International Application No. PCT/EP2021/082537, filed on Nov. 22, 2021, which claims priority to and the benefit of DE 10 2021 101 349.6, filed on Jan. 22, 2021. The disclosures of the above applications are incorporated herein by reference in their entirety.

FIELD

The present disclosure relates to a temperature measuring device for measuring a temperature of a pin-shaped electrical contact element, an assembly with a temperature measuring device, and a method for manufacturing a temperature measuring device.

BACKGROUND

The statements in this section merely provide background information related to the present disclosure and may not constitute prior art.

Increasing current strengths in the field of electromobility bring many wiring and plug systems to their thermal limits. Such a plug system can include, for example, a plurality of pin-shaped electrical contact elements, specifically, contact pins of a charging socket of an electric vehicle. Already slightly increased contact resistances on screw- or plug-contacts can lead to higher temperatures, which should be detected in due time by suitable monitoring measures.

Due to such a case, for example, the charging power or the drive power of an electric vehicle can be reduced, in order to avoid the overheating of the system or other thermal event.

For this purpose, a temperature monitor can be configured which thermally monitors such a plug system. For this purpose, a temperature measuring device can be provided. The more precisely the temperature of the plug system can be measured, the faster a higher temperature can be reacted to.

One possibility to measure the temperature at a contact element is an infrared measurement. Other possibilities comprise, for example, heat-conducting elements that can abut against the cylindrical surface of the contact element.

SUMMARY

This section provides a general summary of the disclosure and is not a comprehensive disclosure of its full scope or all of its features.

The present disclosure provides a temperature measuring device for measuring a temperature of a pin-shaped electrical contact element. The temperature measuring device comprises a flexible circuit board with a first thermally conducting and electrically insulating substrate layer with a contact surface that is configured to lie flat against a flange of the pin-shaped electrical contact element, and an opening disposed in the contact surface, wherein the pin-shaped electrical contact element can be disposed at least partially in the opening; and a second thermally and electrically conducting layer that is disposed on a sensor surface, opposite the contact surface, of the first substrate layer, and includes a sensor element connected to the sensor surface, which sensor element is configured to record a temperature of the pin-shaped electrical contact element when the pin-shaped electrical contact element is at least partially disposed in the opening.

A highly dynamic and nevertheless electrically insulated temperature measurement is thereby made possible at the pin-shaped electrical contact element. The pin-shaped electrical contact element can be disposed plugged or screwed into a charging socket. The heat of the pin-shaped electrical contact element can flow from the pin-shaped electrical contact element via the flange and through the contact surface and the first layer to the sensor surface and the second layer.

Advantages are, for example, a large contact surface for improved heat-flow, a small thermal mass for increasing the measuring dynamics, a good electrical insulation that is scalable up into the higher kV range, a high robustness with respect to mechanical tolerances and vibrations, as well as a simple and automatable assembly concept in order to ensure the scalability at high quantities. A trade-off of measuring accuracy and automated mountability against each other can thus be avoided.

The temperature measuring device therefore includes a flat conductor with a temperature measuring element that can be disposed on a flange, i.e. a shoulder, of the pin-shaped electrical contact element. In one form, the pin-shaped electrical contact element can be a power contact of a charging system for (hybrid) electric vehicles (charging socket or charging gun), and the temperature of the power contact can be monitored with the temperature measuring device.

The pin-shaped electrical contact element includes the flange by which a flat measuring surface arises, onto which the flexible circuit board can be pressed by, in one form, an elastic pressing element. The flange can be shaped specifically for this purpose, e.g., as an encircling plate region of a cylindrical plug contact. The flange can also be used as a contact and measuring surface for the flat conductor as a flat surface with a surface with a different shape, which lies, in one form, orthogonal to the longitudinal axis of the pin-shaped electrical contact element. For this purpose, for example, a welded-on cable lug, or a screwed-on cable lug, or a welded-on conductor rail, or a screwed-on conductor rail can be considered. The flange is, in one form, disposed orthogonally with respect to the longitudinal axis of the pin-shaped electrical contact element, and thus creates an aligned measuring surface for the measuring of the temperature. An automated sandwich assembly can thus be possible.

The temperature measuring device makes possible an electrically insulated and thermally highly dynamic sensor connection and can rapidly and reliably detect a rapid temperature increase. The temperature measuring device is a cost-effective and automatable solution and can thus take into account the increasing number of units in the field of electromobility. In one form, between the pin-shaped electrical contact element and the second layer, which is applied, in one form, by laminating or adhering onto the first layer, the electrical insulation of the inner sensor surface and conductor paths is provided.

The flexible circuit board can be a flat conductor, e.g., a flex board. The flexible circuit board can include a flexible, electrically insulating substrate as the first layer, which can provide a potential separation between the pin-shaped electrical contact element and the sensor element. The pin-shaped electrical contact element can be associated with, for example, an electrical potential between approximately 400

V and 1000 V. The sensor element is, in one form, associated with a lower potential, e.g., the low-voltage wiring system of a vehicle.

The first substrate layer includes an opening through which the pin-shaped electrical contact element can be inserted. In one form, the opening is a hole, and the pin-shaped electrical contact element can be plugged through the opening. The first substrate layer includes a contact surface, and a sensor surface opposite the contact surface.

The contact surface is thermally attachable to the pin-shaped electrical contact element, i.e., the first substrate layer can lie with the contact surface directly on the pin-shaped electrical contact element. A heat-conducting layer can also be introduced between the pin-shaped electrical contact element and the contact surface, by which heat-conducting layer the contact surface is connected to the pin-shaped electrical contact element. The sensor surface of the flat conductor can be shaped such that it mirrors the contact surface on the shoulder of the pin-shaped electrical contact element, and thus uses a maximum heat-flow surface.

The heat-conducting layer can comprise, for example, graphite or a metallic material, and serves for heat splay in order to increase the heat-flow surface. The heat-conducting layer can be designed to be very thin, in one form, thinner than 1 mm, in order to reduce the additional thermal mass in the measuring path. The heat-conducting layer in one form is connected to the first substrate layer, i.e., the flexible substrate, which in one form, is laminated onto or adhered onto the contact surface, or rigidly attached to the pin-shaped electrical contact element, for example, adhered, soldered, or welded, or be an independent component, which in one form, is a slip disk.

In one design, the contact surface is geometrically adapted to the flange of the pin-shaped electrical contact element.

The contact surface can be designed such that an increased surface area lies on the flange of the pin-shaped electrical contact element. In addition, the geometry of the flexible circuit board can be designed such that it can compensate for slight movements of the pin-shaped electrical contact element, caused, for example, by the installing, geometric tolerances, or vibrations, without thereby damaging the second thermally and electrically conducting layer, the sensor surface, or the possibly soldered SMD (strain measurement device) sensor.

In one design, the sensor element comprises a flat conductor path that is disposed on the sensor surface, and comprises a sensor, e.g., in one form a temperature probe, that is thermally connected to the flat conductor rail.

The temperature probe, i.e., the temperature sensor, is thereby brought very close to the pin-shaped electrical contact element, so that a smaller loss in the heat transmission toward the temperature probe can be provided. The sensor surface comprises the temperature probe itself. The sensor surface in one form is an extension of a conductor path that conducts the heat into the soldered-on temperature sensor.

In one design, the sensor surface features a material with a temperature-dependent resistance, or a resistance that changes with temperature changes.

The sensor surface in one form is provided with a material that has a strong temperature-dependent electrical resistance, i.e., a high temperature coefficient of resistance (TCR). Platinum or nickel are suited, in one form, for this purpose of a strong temperature-dependent electrical resistance. For example, a platinum wire is laminated or glued onto the sensor surface on the first substrate layer. The material that has the temperature-dependent electrical resistance represents the sensor element. The sensor element is connected outside the sensor surface to an electrical line. A complete electrical insulation of the temperature measuring device is thus affected with a third electrically insulating layer, since the sensor element does not protrude through the insulation. The structure is also flatter.

In one design, the sensor surface comprises a metal wire disposed in a meander-shaped manner. Thus, the sensor surface area can be exploited to a greater extent.

In one design, the metal wire disposed in a meandering shape is disposed in a low-induction layout.

A coupling of electromagnetic fields in the sensor path due to the current flowing in the pin-shaped electrical contact element can thereby be reduced.

In one design, the sensor surface comprises a structured metal film. The structured metal film, in one form, is a platinum or nickel film that is structured, for example, by laser or etching processes. The structure can meet the same standards as described for the meandering-shaped metal wire.

In one design, the temperature measuring device comprises a third insulating layer on the second layer.

A creepage distance of the electrical current from the pin-shaped electrical contact element, i.e., the high-voltage region, to the sensor element, i.e., the low-voltage region, can hereby be increased. That is, air gaps and/or creepage distances for the electrical insulation of the potentials of the sensor element and/or of the pin-shaped electrical contact element can be taken into account. An additional insulation layer on the sensor surface can therefore be provided. This can be realized, for example, by adhering or laminating a third flexible insulating substrate layer.

The structured metal film in one form is connected to a sensor, which in one form, is an SMD sensor. The third substrate can include an opening at the position of the sensor, through which opening the sensor can be soldered on in the manufacturing process. In order to also realize the electrical insulation on this component, the sensor can be covered with a glob-top casting compound. The sensor can thus be electrically insulated.

If the sensor surface is formed directly as a platinum or nickel path, that is, in one form, as a metal wire arranged in a meandering shape, the covering third substrate layer can be applied without further openings in order to electrically insulate the entire sensor surface, and optionally also adjacent regions of the flexible circuit board. The opening in which the pin-shaped electrical contact element is at least partially arrangeable is formed in each of the substrate layers.

In one design, the second layer comprises at least one electrical line that is configured to electronically connect the temperature measuring device to an evaluating unit. The electrical line can provide a possibility for electrical contacting and a signal line.

Further peripherals are integrated into the flexible circuit board, and additional cables or lines that require space can be avoided. From the sensor surface or the sensor, which in one form, is the SMD sensor, conductor paths lead away to an evaluating unit that can either be applied onto the flexible substrate or else is connected electrically, directly or indirectly, to the conductor paths by a plug-, solder-, weld-, or crimp-connection to the conductor paths, for example, by a further cable.

According to a second aspect, the present disclosure provides an assembly with a temperature measuring device and the pin-shaped electrical contact element, in which the pin-shaped electrical contact element is disposed at least partially in the opening, and the contact surface of the flexible circuit board lies flat on the flange of the pin-shaped electrical contact element.

In one design, the assembly comprises a housing with a first housing part and a second housing part, in which the flange of the pin-shaped electrical contact element abuts against the first housing part, and in which the second housing part exerts a force on the flexible circuit board in the direction of the first housing part, and the contact surface of the flexible circuit board thus presses against the flange of the pin-shaped electrical contact element. The temperature measuring device can thereby be securely fixed.

In one design, an elastic pressing element is disposed between the flexible circuit board and the second housing part. The pressure is thereby exerted via the elastic pressing element onto the flexible circuit board.

The elastic pressing element, for example, a seal such as an O-ring, can serve to press the flexible circuit board onto the flange of the pin-shaped electrical contact element. The elastic property can serve such that even with thermal expansion of the pin-shaped electrical contact element, or mechanical play in an anchor point of the pin-shaped electrical contact element, a sufficient pressing force prevails on the flexible circuit board. The flexible circuit board should thereby abut the pin-shaped electrical contact element with its contact region, i.e., the contact surface, with as much surface area as possible and without an air gap, in order to increase the heat flow from the pin-shaped electrical contact element to the sensor surface of the flexible circuit board under a variety of environmental conditions. In the application case of a charging socket, the elastic pressing element can be realized by a seal of the pin-shaped electrical contact element. For this purpose, the seal is extended far enough along the pin-shaped electrical contact element that in the final assembled state, due to a slight overlap with respect to the flange of the pin-shaped electrical contact element, it presses the flat conductor lying therebetween onto the flange of the pin-shaped electrical contact element.

In one design, a further elastic pressing element is disposed between the flange of the pin-shaped electrical contact element and the first housing part. This can bring a further flexibility, and nevertheless ensure a secure pressing force of the temperature measuring device onto the flange.

According to a third aspect, the present disclosure provides a method for the manufacturing of a temperature measuring device for the measuring of a temperature of a pin-shaped electrical contact element, comprising a provision of a first thermally conducting and electrically insulating substrate layer of a flexible circuit board with a contact surface that is configured to lie flat on a flange of the pin-shaped electrical contact element, and an opening disposed in the contact surface, wherein the pin-shaped electrical contact element is arrangeable at least partially in the opening; and an application of a second thermally and electrically conducting layer onto the provided first substrate layer, including a sensor element disposed on a sensor surface, opposite the contact surface, of the first substrate layer; the sensor element is configured to record a temperature of the pin-shaped electrical contact element on the contact surface when the pin-shaped electrical contact element is at least partially disposed in the opening.

In one design, the method comprises an application of a third insulated layer onto the second layer.

Further areas of applicability will become apparent from the description provided herein. It should be understood that the description and specific examples are intended for purposes of illustration only and are not intended to limit the scope of the present disclosure.

DRAWINGS

Figure 1B:
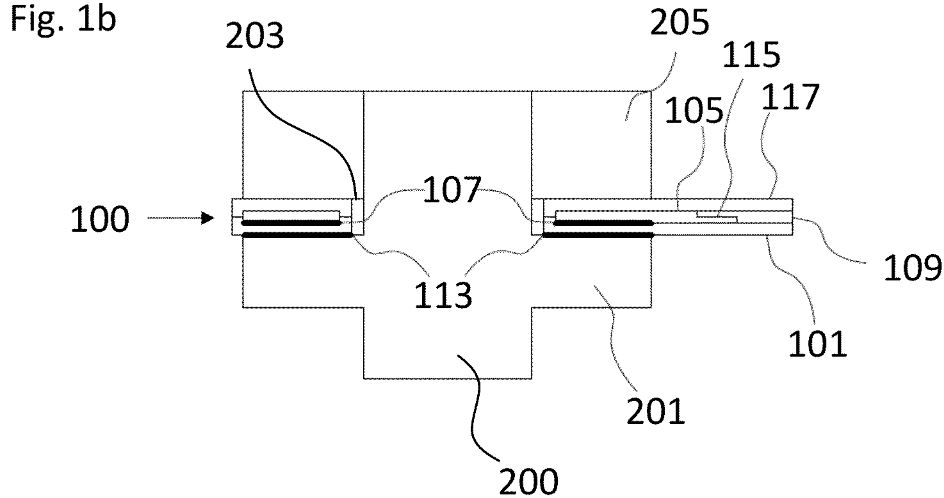

In order that the disclosure may be well understood, there will now be described various forms thereof, given by way of example, reference being made to the accompanying drawings, in which:

FIG. 1*a* shows a temperature measuring device according to one exemplary form of the present disclosure;

FIG. 1*b* shows an assembly with the temperature measuring device according to the exemplary form of FIG. 1*a;*

Figure 2A:
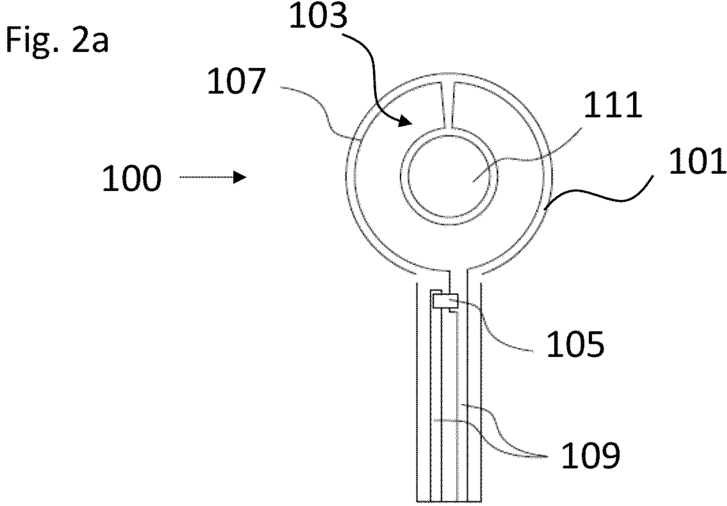
Figure 2B:
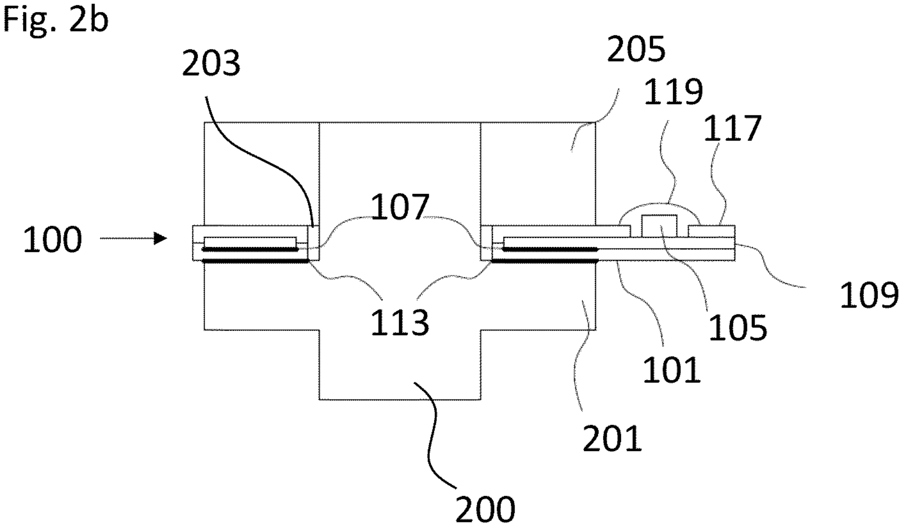

FIG. 2*a* shows a temperature measuring device according to a further exemplary form of the present disclosure;

FIG. 2*b* shows an assembly with the temperature measuring device according to the exemplary form of FIG. 2*a;*

FIG. 3*a* shows a perspective exploded view of the assembly from FIG. 1*b;*

FIG. 3*b* shows a further perspective exploded view of the assembly from FIG. 1*b;*

FIG. 3*c* shows a further perspective exploded view of the assembly from FIG. 1*b;*

Figure 4A:
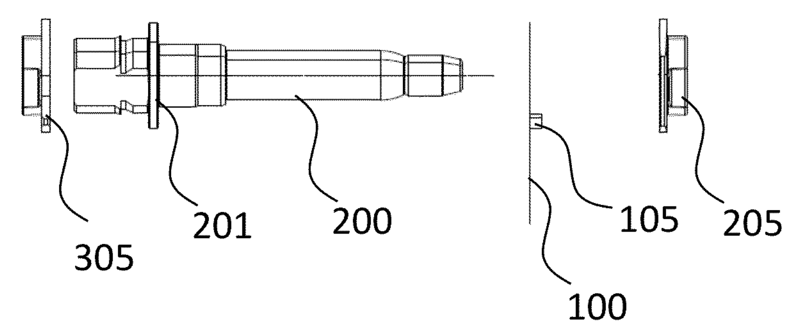

FIG. 4*a* shows a perspective exploded view of the assembly from FIG. 2*b;*

Figure 4B:
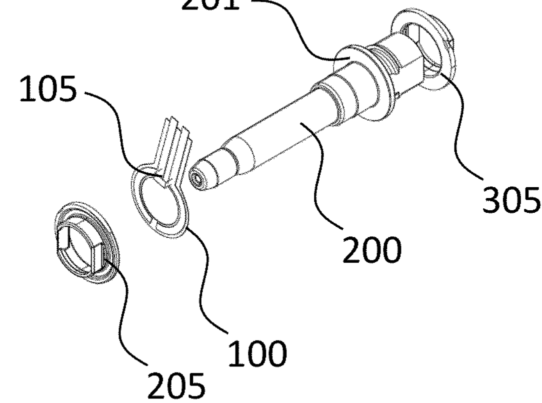

FIG. 4*b* shows a further perspective exploded view of the assembly from FIG. 2*b;*

Figure 4C:
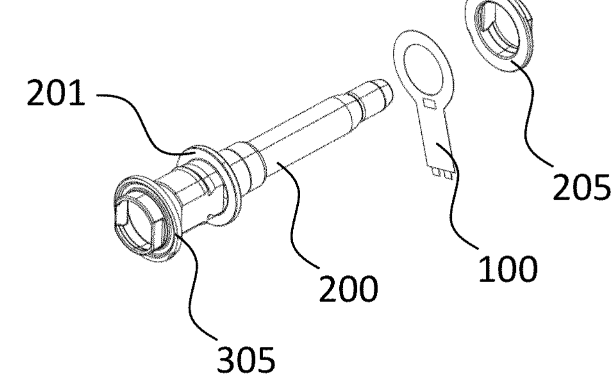

FIG. 4*c* shows a further perspective exploded view of the assembly from FIG. 2*b;*

Figure 5A:
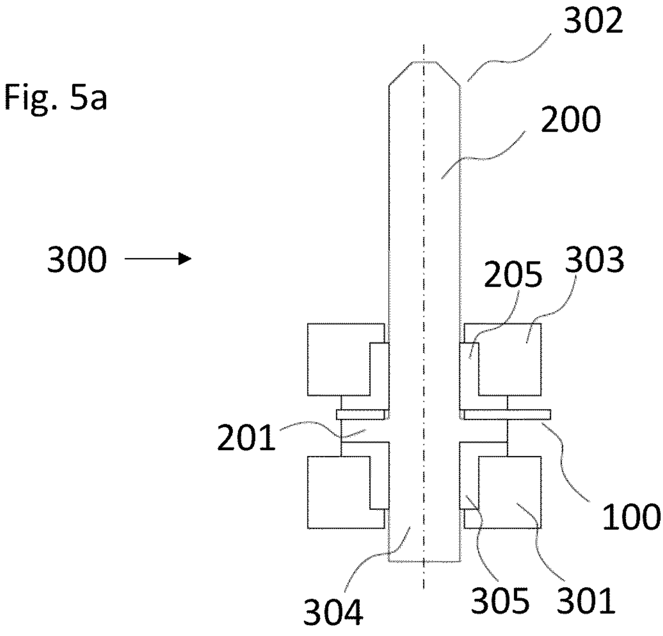
Figure 5B:
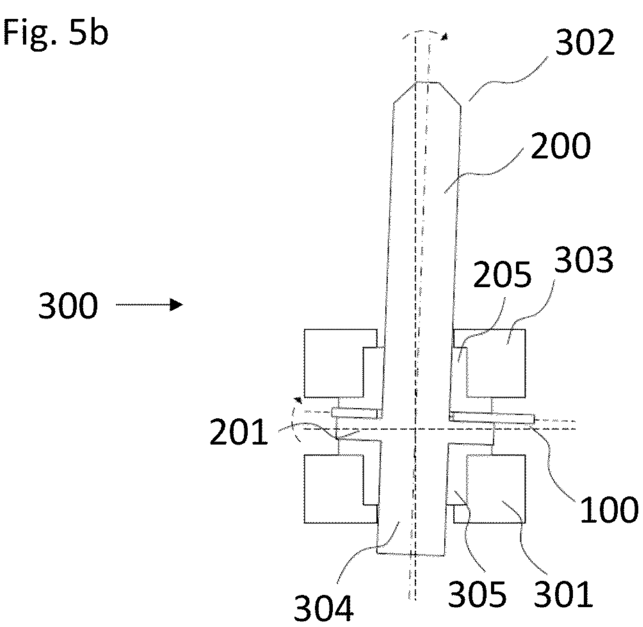
Figure 6:
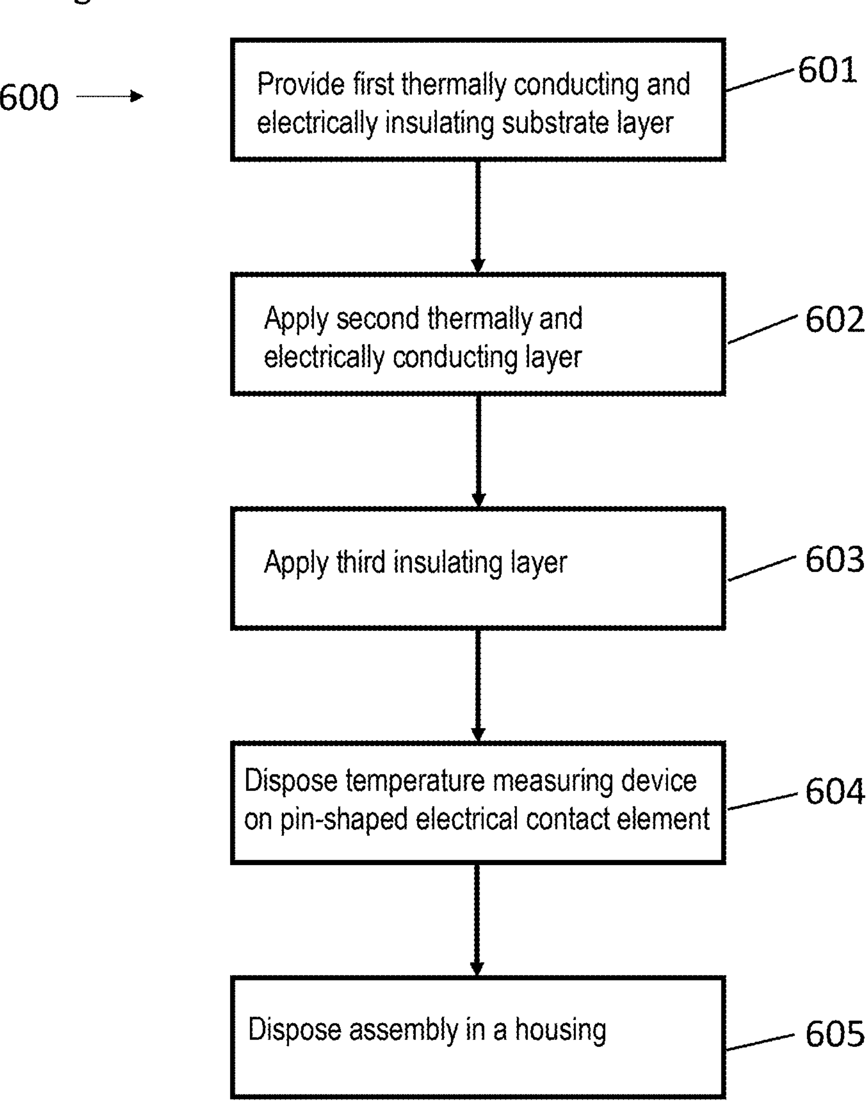

FIG. 5*a* shows an assembly with a temperature measuring device according to an exemplary form in a first position;

FIG. 5*b* shows the assembly according to FIG. 5*a* in a second position; and FIG. 6. shows a flow chart for a method according to an exemplary form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1*a* shows a temperature measuring device 100 according to an exemplary form of the present disclosure. The temperature measuring device 100 includes a first thermally conducting and electrically insulating substrate layer 101. The first substrate layer 101 is an outer layer of a flexible circuit board.

A second thermally and electrically conducting layer 103 is applied onto the first substrate layer 101. The second layer 103 comprises a sensor element 105. The sensor element 105 is designed as a conductor path which in one form is made of platinum or nickel. The sensor element 105 is, in one form, a metal wire that is applied in a meandering manner onto a sensor surface 107; however, for reasons of clarity, in FIG. 1 it is merely depicted as a surface. In a further exemplary form, the sensor element 105 is a film. The sensor element 105 includes a material with a temperature-dependent resistance.

On the first substrate layer 101 an electrical line 109 is furthermore disposed; in one form, the electrical line 109 comprises two conductor paths. The electrical line 109 forms an electrical contact of the sensor element 105 and serves as a signal line. Via the electrical line 109, the resistance of the sensor element 105 is measured by an evaluating unit that for reasons of clarity is not depicted in the Figures.

The temperature measuring device 100 includes an opening 111. The opening 111 in one form is a hole. In a further exemplary form, the opening 111 is disposed such that the sensor surface 107 is U-shaped. That is, the opening 111 is a notch in the temperature measuring device 100.

FIG. 1*b* shows an assembly of the temperature measuring device 100 according to the exemplary form from FIG. 1*a* and a pin-shaped electrical contact element 200. In FIG. 1*b*, only one section of the pin-shaped electrical contact element 200 is depicted. In one form, the pin-shaped electrical contact element 200 extends vertically towards the temperature measuring device 100 farther than shown in FIG. 1*b*. The pin-shaped electrical contact element 200 includes a flange 201.

The temperature measuring device 100 includes a contact surface 113. The temperature measuring device 100 lies with the contact surface 113 flat on the flange 201. A large contact surface thereby results between the pin-shaped electrical contact element 200 and the temperature measuring device 100, via which contact surface heat is conducted from the pin-shaped electrical contact element 200 to the temperature measuring device 100, i.e., the sensor element 105 heats the temperature measuring device 100 by the heat from the pin-shaped electrical contact element 200. Since the first substrate layer 101 is thin, the heat loss is low.

The opening 111 of the temperature measuring device 100 is adapted to an outer contour of the pin-shaped electrical contact element 200, so that although a gap 203 arises between the pin-shaped electrical contact element 200 and the temperature measuring device 100 for the compensating of tolerances and movements, at the same time, the gap 203 remains so small that the surface of the flange 201 can be covered by the contact surface 113 to a greater extent.

In FIG. 1*b*, a transition 115 is seen between the sensor element 105 and the electrical line 109, at which the sensor element 105 and the electrical line 109 are connected to each other. The two different materials are soldered to each other. In a further exemplary form, the same materials are used and/or a different type of connection is chosen other than soldering.

In FIG. 1*b*, a third insulating layer 117 is also depicted. The third insulating layer 117 is applied onto the second layer 103. The third insulating layer 117 protects the second layer 103 from environmental influences, and represents an electrical insulation both of the sensor element 105 and of the electrical line 109. In a further exemplary form, this third layer is omitted, and the electrical insulation is effected by an elastic pressing element 205, i.e., an element which is pressed on, for example, a seal. The second layer 103 is fully covered on the contact surface 113 by the third insulating layer 117. In a further exemplary form, the third insulating layer 117 only partially covers the second layer 103.

The sensor surface 107 is chosen to be so large that an edge of the first substrate layer 101 protrudes over the second layer 103, so that an adhering of the first substrate layer to the third insulating layer 117 is possible in order to ensure the electrical insulation of the second layer 103. In one form, the edge is at least 100 μm for the adhering. After adhering the first substrate layer 101 to the third insulating layer 117, an edge of 1 mm to 2 mm offers a larger horizontal insulation or a larger creepage distance. In a further exemplary form, instead of an adherence, a weld of the first substrate layer 101 with the third insulating layer 117 is used. The connection of the first substrate layer 101 to the third insulating layer 117, in one form, withstands 130 degrees Celsius in order to avoid releasing in operation.

In FIG. 1*b*, an elastic pressing element 205 is depicted, which is used in addition to the third insulating layer 117. The elastic pressing element 205 is an elastic element, for example, a seal, that is pressed onto the temperature measuring device 100 in order to hold the temperature measuring device 100 in position. This is described more precisely in FIGS. 5*a* and 5*b*.

In FIG. 2*a*, a temperature measuring device 100 according to a further exemplary form is depicted. As described for the exemplary form of FIG. 1*a*, the temperature measuring device 100 according to FIG. 2*a* includes a first substrate layer 101, a sensor surface 107, and a second layer 103. However, the sensor element 105 is an SMD temperature probe, which in one form, is a PT1000 or NTC (negative temperature coefficient). The sensor surface 107 is a conductor path, which conducts the heat into the sensor element 105, i.e., the soldered-on temperature sensor. As described in FIG. 1*a*, the sensor element 105 is read via the electrical line 109. The opening 111 is designed identically as described in FIG. 1*a*.

FIG. 2*b* shows an assembly as described in FIG. 1*b*, wherein the temperature measuring device 100 according to the exemplary form of FIG. 2*a* is used, in which the sensor element 105 comprises an SMD temperature sensor.

The sensor element 105 of the temperature measuring device 100 according to the exemplary forms of FIGS. 2*a* and 2*b* has an interruption in the third insulating layer 117 in the region of the sensor element 105, so that the sensor element 105 is, in one form, soldered directly on the second layer 103. The interruption in the third insulating layer and in the sensor element 105 are covered by a casting mass 119, which in one form, is a glob top, and thus electrically insulated and protected against environmental influences.

In all exemplary forms, a pin-shaped electrical contact element whose temperature is to be measured is arrangeable in the opening 111.

FIGS. 3*a* to 3*c* show exploded views of the assembly according to FIGS. 1*a* and 1*b*. FIGS. 4*a* to 4*c* show exploded views of the assembly according to the FIGS. 2*a* and 2*b*. The individual components are separated from one another in the axial direction of the pin-shaped electrical contact element 200.

FIGS. 5*a* and 5*b* each show a sectional view of an assembly 300 with a temperature measuring device 100. The temperature measuring device 100 is schematically depicted and corresponds to one of the above-described exemplary forms or can also be modified. In one form, a sectional view is depicted along the longitudinal axis of the pin-shaped electrical contact element 200.

As described above for FIGS. 1*b* and 2*b*, the assembly 300 includes a pin-shaped electrical contact element 200, the temperature measuring device 100, and an elastic pressing element 205. The pin-shaped electrical contact element 200, which in one form, is a charging socket, comprises an outer plug region 302 for electrical connection with a charging gun. The pin-shaped electrical contact element 200 comprises a vehicle-interior output region 304 to which a high-voltage wiring harness is attached.

In addition, a first housing part 301 and second housing part 303 are depicted. The flange 201 of the pin-shaped electrical contact element 200 abuts against the first housing part 301. The second housing part 303 exerts a force on the first substrate layer 101 towards the first housing part 301.

The second housing part 303 abuts with the elastic pressing element 205 against the temperature measuring device 100, and presses the temperature measuring device 100 with the contact surface 113 against the flange 201.

A further elastic pressing element 305 is disposed between the first housing part 301 and the contact surface 113. In a further exemplary form, the assembly 300 comprises only one of the two elastic pressing elements 205, 305, or none, and the first housing part 301 abuts directly against the flange 201, or the second housing part 303 abuts directly against the first substrate layer 101, which in one form, is on the third insulating layer 117.

In FIG. 5*a*, the pin-shaped electrical contact element 200 is in a normal position. That is, no lateral force acts on the pin-shaped electrical contact element 200, i.e., no force acts perpendicular to the main extension direction of the pin-shaped electrical contact element 200. However, for example, when a charging plug is plugged in, not depicted in the Figures, tilting or other impairments occur that exert a lateral force on the pin-shaped electrical contact element 200.

Such a case is schematically depicted in FIG. 5*b*. A lateral force acts on the pin-shaped electrical contact element 200, which results in a twisted alignment, in comparison to the alignment according to FIG. 5*a* of the pin-shaped electrical contact element 200; see arrows in FIGS. 5*a* and 5*b*.

The elastic pressing elements 205, 305 represent a flexible support of the pin-shaped electrical contact element 200. The first housing part 301 and the second housing part 303 include the temperature measuring device 100, i.e., the measuring assembly.

FIG. 6 shows a flow diagram 600 for a method for the manufacture of a temperature measuring device 100 according to an exemplary form.

In one step 601, the first thermally conducting and electrically insulating substrate layer 101 is provided. The first substrate layer 101 includes a contact surface 113 that is configured to lie flat against a flange 201 of the pin-shaped electrical contact element 200. The contact surface 113 includes the opening 111, in which the pin-shaped electrical contact element 200 is at least partially arrangeable in the opening 111.

In a subsequent step 602, the second thermally and electrically conducting layer 103 is applied onto the provided first substrate layer 101. The second layer 103 includes a sensor element 105 which is opposite on the contact surface 113 and is arranged on the sensor surface 107 of the first substrate layer 101. In a further exemplary form, the sensor element 105 is applied after the application of the second layer 103 onto the first substrate layer 101.

In a step 603, the third insulating layer 117 is applied onto the second layer 103. The third insulating layer 117 is adhered to the first substrate layer 101 at the edge around the second layer 103. In a further exemplary form, the third insulating layer 117 and the first substrate layer 101 are connected to each other differently. In an alternative exemplary form, the third insulating layer 117 is omitted. An elastic pressing element 205 directly abuts the second layer 103 and, in addition to providing a pressing force, also assumes the function of the electrical insulation.

In a step 604, the temperature measuring device 100 is disposed on a pin-shaped electrical contact element 200. The temperature measuring device 100 is either plugged onto the pin-shaped electrical contact element 200, or the pin-shaped electrical contact element 200 is introduced into the opening 111 of the temperature measuring device 100. The temperature measuring device 100 then abuts with the contact surface 113 against the flange 201 of the pin-shaped electrical contact element 200, as described above in FIGS. 1*b*, 2*b*, 5*a*, and 5*b*.

In a step 605, the assembly created in step 604 is disposed in a housing with the first housing part 301 and the second housing part 303. The elastic pressing element 205 and the further elastic pressing element 305 are thereby interposed. In a further exemplary form, in step 605, the step of the interposing of one or both elastic pressing elements 205, 305 is omitted.

Assembly is effected automatically. The following steps are carried out: introducing the pin-shaped electrical contact element 200 into the first housing part 301, optionally with the further elastic pressing element 305 already inserted; placing an additional heat-conducting element, for example, a graphite disk, onto the further elastic pressing element 305; and applying the first layer 101 onto the flange 201 of the pin-shaped electrical contact element 200 follows. The electric line 109 of the second layer 103 is connected to the evaluating unit, a plug, or another contact system. Then the elastic pressing element, i.e., the seal, and the second housing part 303 are pushed on in order to press the temperature measuring device 100 onto the flange 201 of the pin-shaped electrical contact element 200.

In a further exemplary form, one of the steps of placing an additional heat conductor element, producing a connection of the electrical line 109 of the second layer(?) 103 with the evaluating unit, or even both steps, is omitted.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A temperature measuring device for measuring a temperature of a pin-shaped electrical contact element, the temperature measuring device comprising:

a flexible circuit board comprising:

a first thermally conducting and electrically insulating substrate layer comprising:

a contact surface that is configured to lie flat against a flange of the pin-shaped electrical contact element; and an opening disposed in the contact surface, wherein the pin-shaped electrical contact element is at least partially disposed in the opening; and a second thermally and electrically conducting layer that is disposed on a sensor surface opposite the contact surface of the first thermally conducting and electrically insulating substrate layer and includes a sensor element connected to the sensor surface, which is configured to record a temperature of the pin-shaped electrical contact element when the pin-shaped electrical contact element is disposed at least partially in the opening.

2. The temperature measuring device according to claim 1, wherein the contact surface is geometrically adapted to the flange of the pin-shaped electrical contact element.

3. A temperature measuring device for measuring a temperature of a pin-shaped electrical contact element, the temperature measuring device comprising:

a flexible circuit board comprising:

a first thermally conducting and electrically insulating substrate layer comprising:

a contact surface that is configured to lie flat against a flange of the pin-shaped electrical contact element; and an opening disposed in the contact surface, wherein the pin-shaped electrical contact element is at least partially disposed in the opening; and a second thermally and electrically conducting layer that is disposed on a sensor surface opposite the contact surface of the first thermally conducting and electrically insulating substrate layer and includes a sensor element connected to the sensor surface, which is configured to record a temperature of the pin-shaped electrical contact element when the pin-shaped electrical contact element is disposed at least partially in the opening and the sensor element comprises a flat conductor path that is disposed on the sensor surface and comprises a temperature probe that is thermally connected to the flat conductor path.

4. The temperature measuring device according to claim 1, wherein the sensor surface includes a material with a temperature-dependent resistance.

5. The temperature measuring device according to claim 4, wherein the sensor surface comprises a metal wire disposed in a meandering manner.

6. The temperature measuring device according to claim 5, wherein the metal wire disposed in a meandering manner is disposed in a low-induction layout.

7. The temperature measuring device according to claim 4, wherein the sensor surface comprises a structured metal film.

8. The temperature measuring device according to claim 1, further comprising a third insulating layer on the second thermally and electrically conducting layer.

9. The temperature measuring device according to claim 1, wherein the second thermally and electrically conducting layer comprises at least one electrical line that is configured to connect the temperature measuring device electronically to an evaluating unit.

10. The temperature measuring device according to claim 1, wherein the pin-shaped electrical contact element is disposed at least partially in the opening, and the contact surface of the flexible circuit board lies flat against the flange of the pin-shaped electrical contact element.

11. The temperature measuring device according to claim 10, further comprising a housing with a first housing part and a second housing part, wherein the flange of the pin-shaped electrical contact element abuts against the first housing part, and wherein the second housing part exerts a force on the flexible circuit board in the direction of the first housing part, and thus presses the contact surface of the flexible circuit board against the flange of the pin-shaped electrical contact element.

12. The temperature measuring device according to claim 11, wherein an elastic pressing element is disposed between the flexible circuit board and the second housing part, and wherein pressure is exerted via the elastic pressing element onto the flexible circuit board.

13. The temperature measuring device according to claim 11, wherein a further elastic pressing element is disposed between the flange of the pin-shaped electrical contact element and the first housing part.

14. A method for manufacturing a temperature measuring device for measuring a temperature of a pin-shaped electrical contact element, the method comprising:

providing a first thermally conducting and electrically insulating substrate layer of a flexible circuit board with a contact surface that is configured to lie flat against a flange of the pin-shaped electrical contact element, and an opening disposed in the contact surface, wherein the pin-shaped electrical contact element is disposed at least partially in the opening; and applying a second thermally and electrically conducting layer onto the provided first thermally conducting and electrically insulating substrate layer, including a sensor element disposed on a sensor surface opposite the contact surface of the first thermally conducting and electrically insulating substrate layer, which sensor element is configured to record a temperature of the pin-shaped electrical contact element on the contact surface when the pin-shaped electrical contact element is disposed at least partially in the opening.

15. The method according to claim 14, further comprising an application of a third insulating layer onto the second thermally and electrically conducting layer.

* * * * *